(12) United States Patent
Liu et al.

(10) Patent No.: US 7,874,348 B2
(45) Date of Patent: Jan. 25, 2011

(54) FAN HOLDER

(75) Inventors: Jian Liu, Shenzhen (CN); Jun Luo, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 348 days.

(21) Appl. No.: 12/202,403

(22) Filed: Sep. 1, 2008

(65) Prior Publication Data

US 2010/0051230 A1 Mar. 4, 2010

(51) Int. Cl.
*H05K 7/20* (2006.01)
(52) U.S. Cl. ............... 165/121; 165/104.33; 415/213.1; 361/697; 248/500
(58) Field of Classification Search ................. 165/121, 165/122; 361/697; 415/213.1, 214.1, 220; 248/346.4, 500, 671
See application file for complete search history.

(56) References Cited

U.S. PATENT DOCUMENTS

| | | | | |
|---|---|---|---|---|
| 4,834,615 | A * | 5/1989 | Mauch et al. ............. 415/213.1 |
| 5,186,605 | A * | 2/1993 | Tracy .............................. 601/2 |
| 5,890,693 | A * | 4/1999 | Do et al. ................ 248/346.03 |
| 5,969,941 | A * | 10/1999 | Cho ........................ 361/679.48 |
| 6,183,214 | B1 * | 2/2001 | Ko ............................... 417/360 |
| 6,244,953 | B1 * | 6/2001 | Dugan et al. ................. 454/184 |
| 6,427,763 | B1 * | 8/2002 | Matsumoto ................. 165/80.3 |
| 6,435,889 | B1 * | 8/2002 | Vinson et al. ................ 439/247 |
| 6,493,225 | B2 * | 12/2002 | Chuang et al. .............. 361/695 |
| 6,592,327 | B2 * | 7/2003 | Chen et al. ................ 415/213.1 |
| 6,625,021 | B1 * | 9/2003 | Lofland et al. .............. 361/697 |
| 6,788,536 | B2 * | 9/2004 | Lai et al. ..................... 361/697 |
| 6,874,566 | B1 * | 4/2005 | Artman et al. ............. 165/80.3 |
| 7,147,435 | B2 * | 12/2006 | Lien et al. ................. 415/213.1 |
| 7,172,390 | B2 * | 2/2007 | Lu et al. ................... 415/213.1 |
| 7,174,951 | B1 * | 2/2007 | Lin ........................ 165/104.33 |
| 7,230,826 | B2 * | 6/2007 | Kyle et al. ................... 361/695 |
| 7,304,843 | B2 * | 12/2007 | Peng et al. .............. 361/679.48 |
| 7,440,271 | B2 * | 10/2008 | Chen et al. ............. 361/679.33 |
| 7,443,679 | B2 * | 10/2008 | Li et al. ....................... 361/704 |
| 7,611,328 | B2 * | 11/2009 | Peng et al. ................ 415/213.1 |
| 7,633,756 | B2 * | 12/2009 | Xu .............................. 361/700 |
| 7,713,025 | B2 * | 5/2010 | Chen et al. ................ 415/213.1 |
| 2005/0099774 | A1 * | 5/2005 | Song .......................... 361/700 |
| 2006/0284038 | A1 * | 12/2006 | Hartman et al. .......... 248/298.1 |

* cited by examiner

*Primary Examiner*—Allen J Flanigan
(74) *Attorney, Agent, or Firm*—Frank R. Niranjan

(57) ABSTRACT

A fan holder used to secure a fan to a heat dissipation device, includes a main body for mounting the fan thereon, a pair of blocking wings and a pair of baffle walls extending from the main body to define a space for receiving the fan therein. The blocking wings each include a pair of locking protrusions engaging in the fan to prevent the fan from moving vertically. The baffle walls each includes a pair of blocking flanges fittingly received in cutouts defied in the fan to prevent the fan from moving horizontally along a lateral direction of the fan holder. The baffle walls engage with front and rear sides of the fan for preventing the fan from moving along a front-to-rear direction.

13 Claims, 5 Drawing Sheets

FAN HOLDER

BACKGROUND OF THE INVENTION

1. Field of the Invention

The present invention relates to a fan holder, and more particularly to a fan holder to which a fan is attached. The fan is sandwiched between a pair of fin assemblies of a heat dissipation device. The fan holder can facilitate an assembly of the fan into the heat dissipation device and effectively enhance an airflow generated by the fan through the fin assemblies of the heat dissipation device.

2. Description of Related Art

A heat dissipation device is usually placed in thermal contact with an electronic package, such as a central processing unit (CPU), to transfer heat through conduction away from the electronic package, thus preventing an overheating of the electronic package.

A typical heat dissipation device generally comprises a heat sink for absorbing heat from an electronic component mounted on a printed circuit board and a fan mounted on a lateral side of the heat sink. A fan holder is used for connecting the fan and the heat sink to mount the fan onto the lateral side of the heat sink. The fan is located at the lateral side of the heat sink by the fan holder. An airflow generated by the fan cannot totally flow through the heat sink to reach an opposite lateral side of the heat sink easily; thus, the heat dissipation efficiency of the conventional heat dissipation device is not high by an arrangement of the fan being attached to the lateral side of the heat sink.

To solve the above disadvantage, the fan is needed to be mounted in a middle portion of a heat sink of a heat dissipation device, thereby to enable the airflow generated by the fan to flow through the whole heat sink easily. Accordingly, a fan holder which is used to hold the fan and secure the fan in the middle portion of the heat sink is desired.

Therefore, an improved fan holder, which can reliably and easily secure a fan in a middle portion of a heat sink is desired.

SUMMARY OF THE INVENTION

The present invention relates to a fan holder used to secure a fan to a base of a heat dissipation device. According to a preferred embodiment of the present invention, the fan holder includes a main body for mounting the fan thereon, and a pair of blocking wings and a pair of baffle walls extending from the main body to define a space for receiving the fan therein. The blocking wings each include a pair of locking protrusions engaging in the fan to prevent the fan from moving vertically along a bottom-to-top direction of the fan holder. The baffle walls each include a pair of blocking flanges fittingly received in cutouts defied in the fan to prevent the fan from moving horizontally along a lateral direction of the fan holder. The baffle walls engage with front and rear sides of the fan for preventing the fan from moving along a front-to-rear direction. A connecting portion interconnects the main body and a corresponding blocking wing and is located a distance above the main body, wherein fasteners are used to extend through the connecting portions and the main body to threadedly engage with a base on which the fan holder is mounted. When the fasteners are vertically inserted to threadedly engage with the base, the locking protrusions are horizontally moved to securely engage with the fan.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
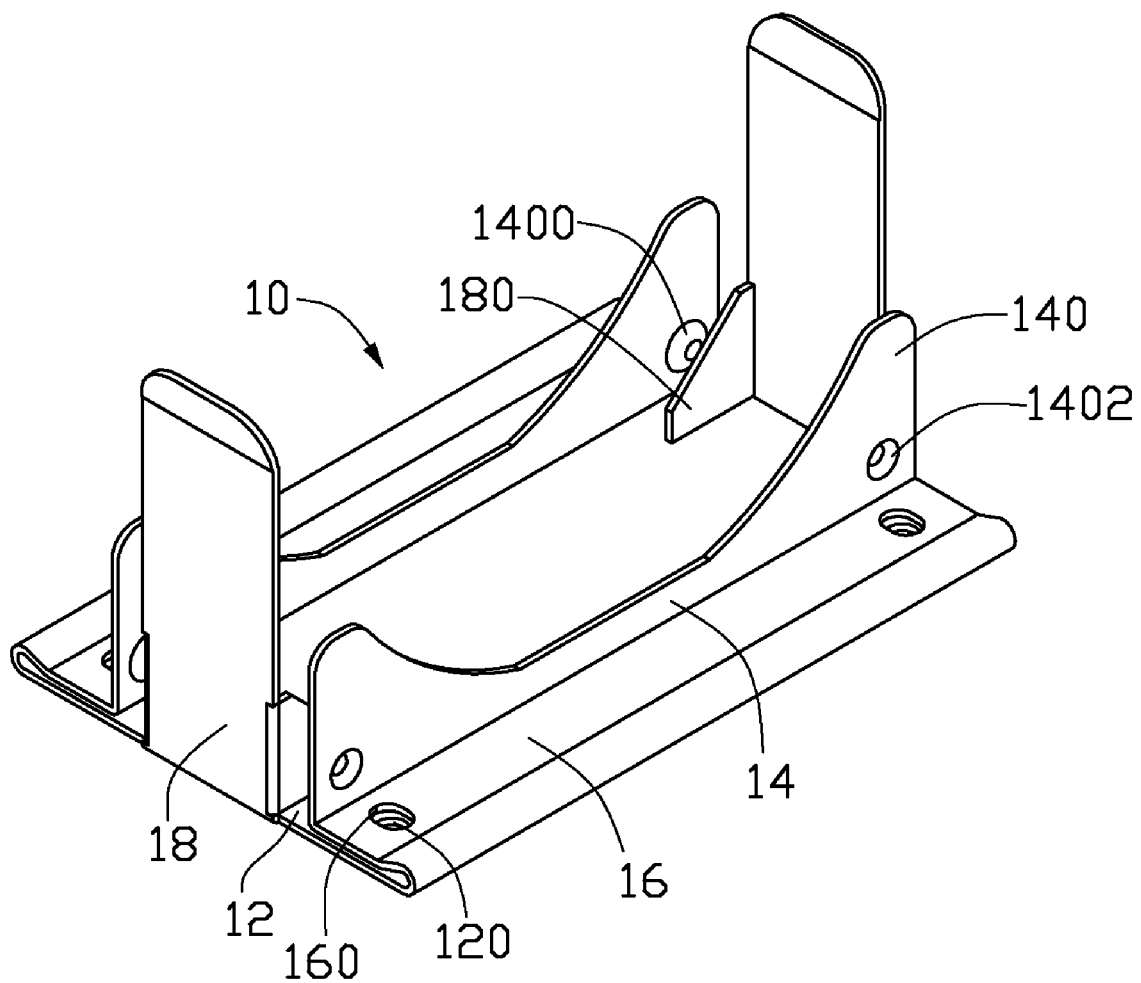
FIG. 1 is an isometric view of a fan holder in accordance with a preferred embodiment of the present invention.
Figure 2:
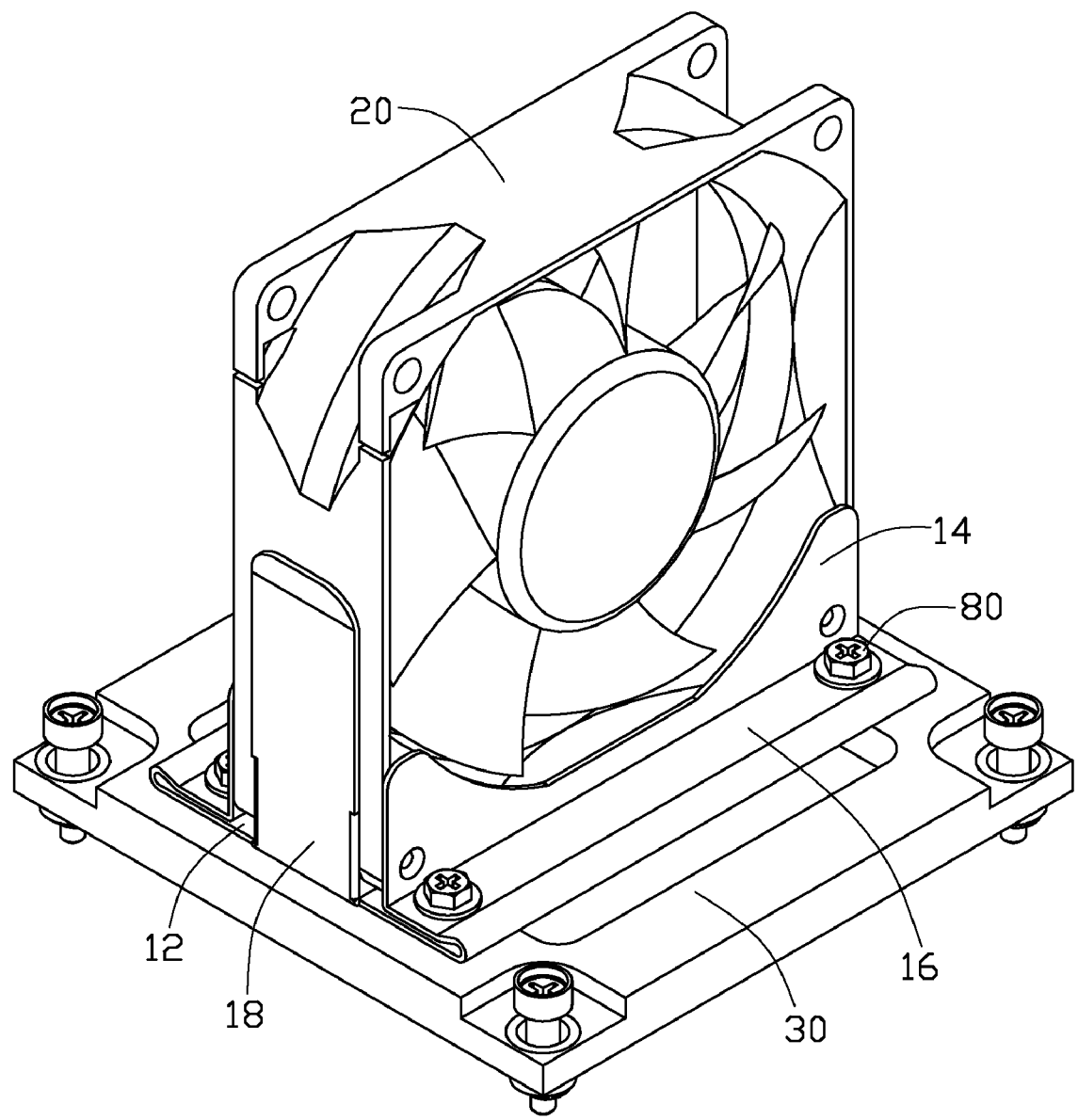
FIG. 2 is an assembled view of the fan holder mounting a fan to a base of a heat dissipation device.
Figure 3:
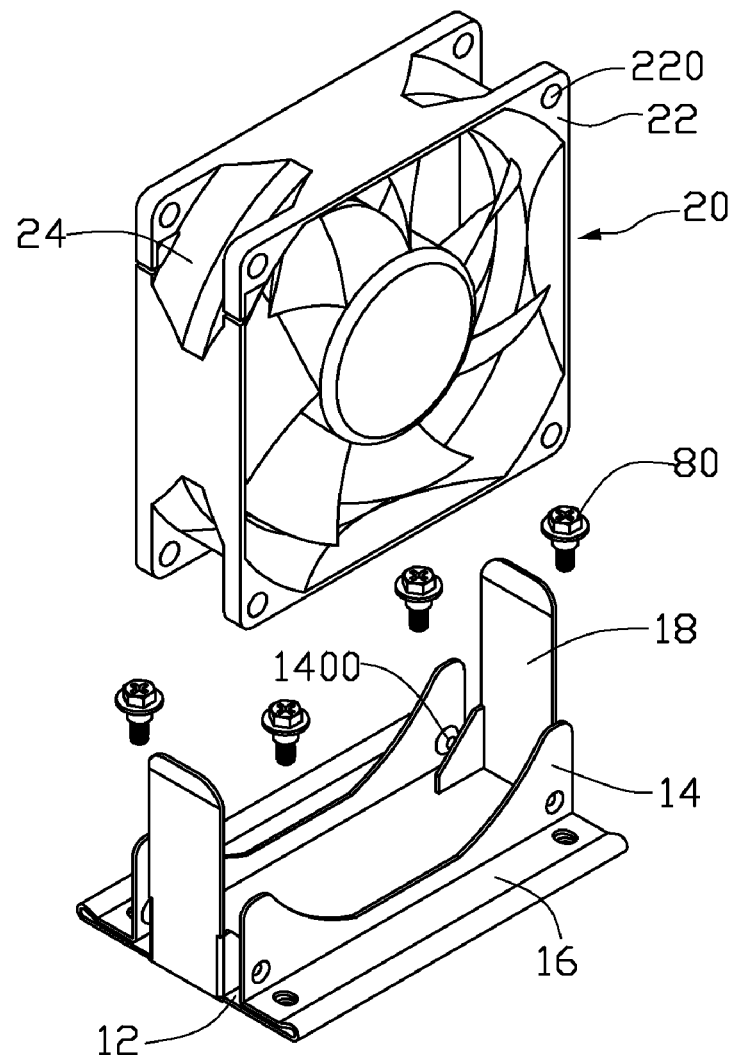
FIG. 3 is an exploded view of FIG. 2.
Figure 3:
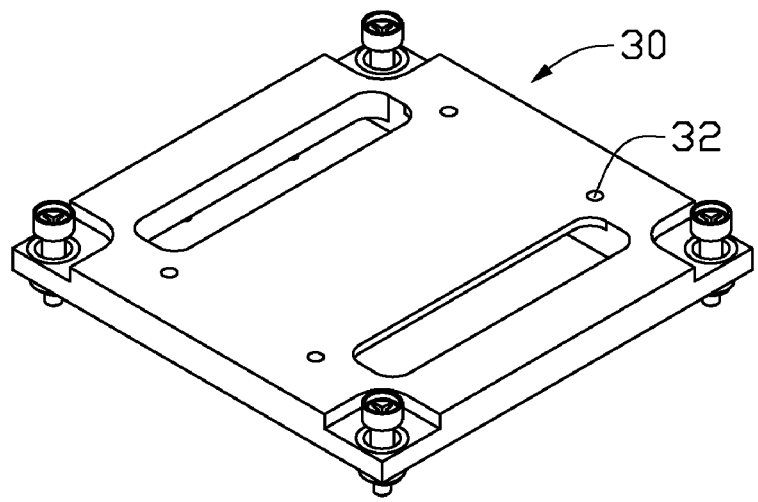
Figure 4:
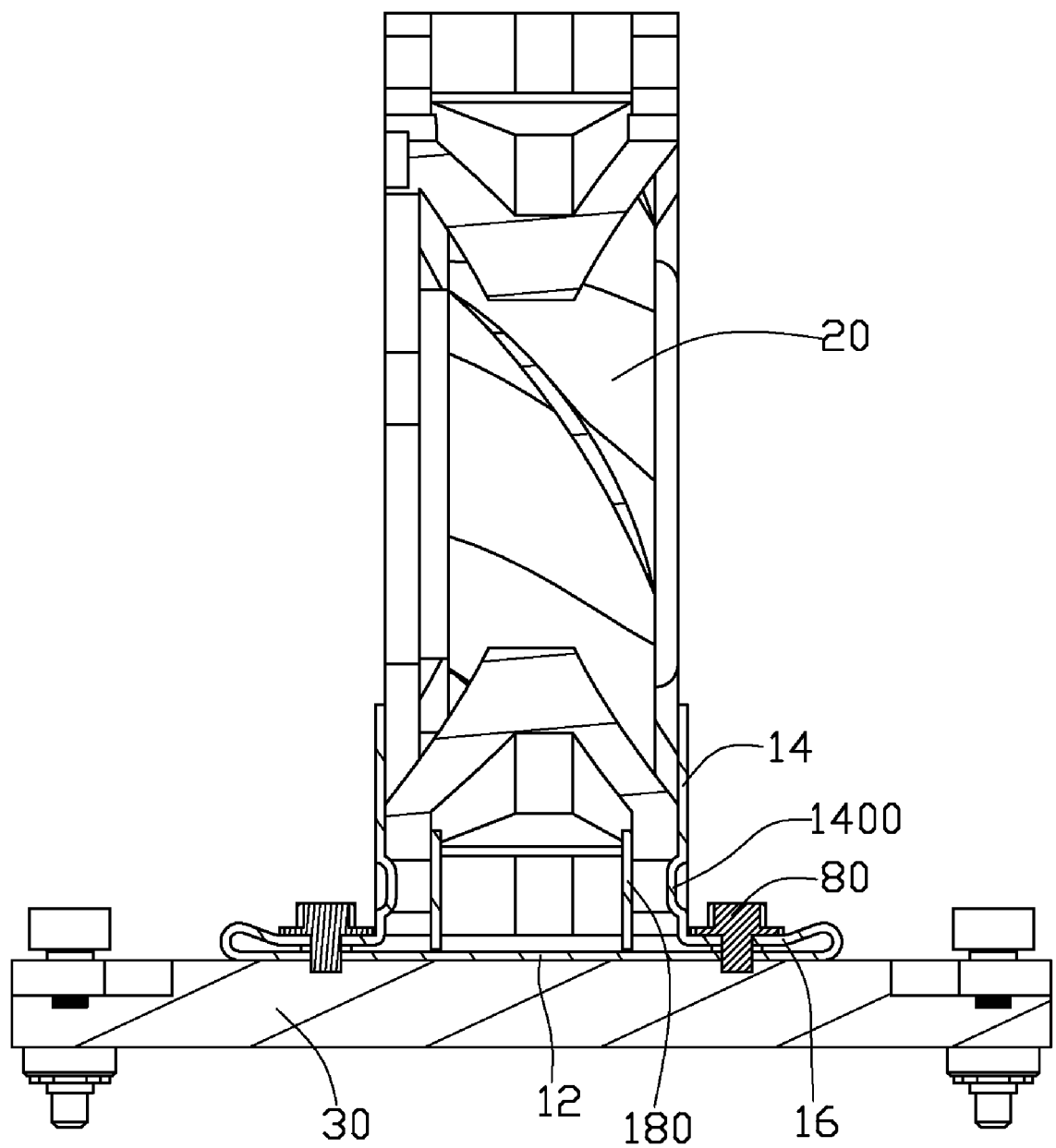
FIG. 4 is a cross-sectional view of FIG. 2 along a lateral side of the fan.
Figure 5:
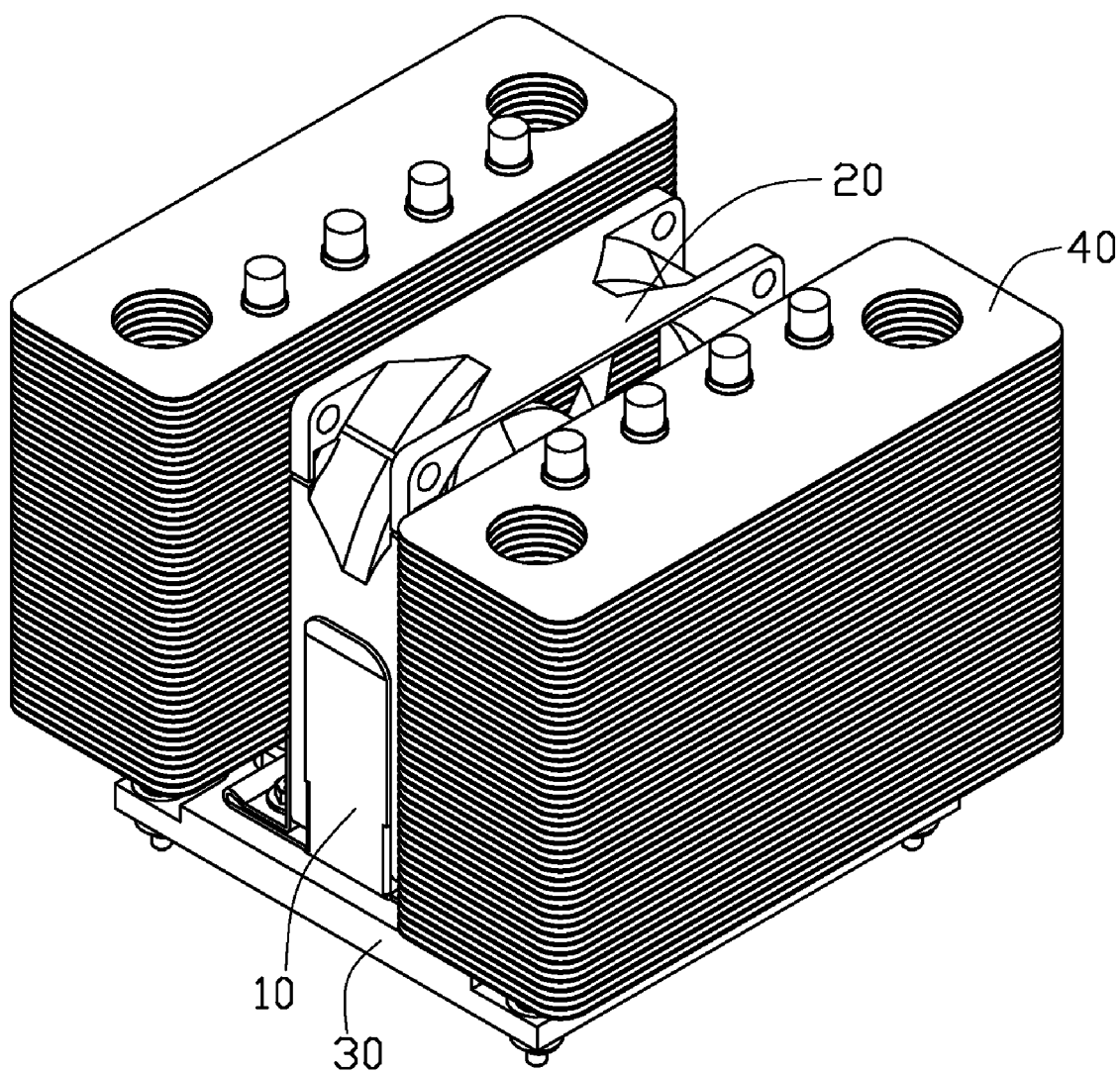
FIG. 5 is a view similar to FIG. 2, with a pair of fin assemblies mounted to the base, wherein the fan is positioned between the pair of fin assemblies.

Referring to FIG. 1, a fan holder 10 in accordance with a preferred embodiment of the present invention is illustrated. Referring to FIGS. 2-5, the fan holder 10 is used to secure a fan 20 to a base 30 of a heat dissipation device (not labeled), in which the fan 20 is located between a pair of fin assemblies 30 of the heat dissipation device.

The fan holder 10 comprises a flat rectangular main body 12 and a pair of blocking wings 14 integrally formed from the main body 12. The main body 12 defines four fixing holes 120 in four corners thereof. The blocking wings 14 extend upwardly and perpendicularly from two opposite long sides of the main body 12. Each blocking wing 14 has a pair of hump-shaped upper ends 140 at two opposite sides thereof and an arc-shaped, recessed edge (not labeled) formed between the two upper ends 140. A locking protrusion 1400 is formed at an inner face of the blocking wing 14, located below a corresponding upper end 140. A depression 1402 is defined in an outer face of the blocking wing 14, located corresponding to the locking protrusion 1400. A pair of connecting portions 16 each are located between the main body 12 and a corresponding blocking wing 14. The connecting portions 16 extend inwardly from the two opposite long sides of the main body 12 and parallel to the main body 12. The connecting portions 16 are located above the main body 12. A pair of through holes 160 corresponding to the fixing holes 120 are defined near two opposite short sides of each connecting portion 16, adjacent to the depressions 1402 of the each blocking wing 14. A pair of baffle walls 18 are located at middle portions of two opposite short sides of the main body 12. The baffle walls 18 each are rectangular and extend upwardly and perpendicularly from edges of the two opposite short sides of the main body 12. Each baffle wall 18 has a height twice of that of the locking wing 14 measured from a bottom to the upper ends 140 of the locking wing 14. A pair of blocking flanges 180 extend inwardly and horizontally from two opposite lateral sides of each baffle wall 18. The blocking flanges 180 each have a pentagonal shape and are located parallel to each other and perpendicular to the each baffle wall 18. The baffle walls 18 are located between the two blocking wings 14. In this embodiment of the present invention, the blocking wings 14 and the connecting portions 16 are located above the main body 12 and a space between the main body 12 and the connecting portions 16 is ranged from 1 mm to 3 mm, thereby providing a space for the connecting portion 16 to move towards the main body 12 when a screw 80 is extended through the through hole 160 and the fixing hole 120 and screwed into the base 30 of the heat dissipation device.

The fan 20 has a square configuration and comprises a pair of parallel plates (not labeled). Four pairs of ears 22 are extended outwardly from side edges of the parallel plates at four corners of the fan 20. Each pair of the ears 22 are located parallel to each other and each ear 22 defines a mounting hole 220 in a center thereof. Lower four ones of the mounting holes 220 receive the locking protrusions 1400 of the fan holder 10 therein. Four cutouts 24 are defined at the four corners of the fan 20 and each are located between each pair of the ears 22 of the fan 20.

The base 30 has a rectangular configuration. The base 30 has a bottom face (not labeled) for contacting a CPU (not shown) to absorb heat therefrom. Four screwing holes 32 are defined in the base 30 near four corners thereof. Four fasteners (not labeled) are threadedly engaged in the base 30, thereby to secure the base 30 to a printed circuit board (not shown) by the four fasteners to threadedly engage with a retainer (not shown) attached to a bottom face of the printed circuit board. The two fin assemblies 40 are thermally attached to two opposite sides of a top face of the base 30, thereby to sandwich the fan 20 and the fan holder 10 therebetween.

In assembly of the fan 20 to the fan holder 10, firstly, the fan holder 10 is placed on the top face of the base 30, with the fixing holes 120 and the through holes 160 aligned with the screwing holes 32 of the base 30; then the fan 20 is received in the fan holder 10 with the baffle walls 18 engage with front and rear sides of the fan 20. The blocking flanges 180 of the fan holder 10 are fitted in lower two of the four cutouts 24, wherein the four baffle walls 18 engage with facing inner faces of the parallel plates of the fan 20. Four screws 80 extend through the through holes 160 and the fixing holes 120 of the fan holder 10 to threadedly engage in the screwing holes 32 of the base 30, whereby the connecting portions 16 of the fan holder 10 are pressed downwardly towards the main body 12 of the fan holder 10 and the locking protrusions 1400 of the fan holder 10 are moved horizontally and inwardly to insert into the lower four of the eight mounting holes 220 of the fan 20. Accordingly, the fan 20 is firmly mounted on the base 30 and enclosed by the fan holder 20. Since the front and rear sides of the fan 20 are blocked by the baffle walls 18 of the fan holder 10, the fan holder 10 can prevent the fan 20 from moving horizontally along a front-to-rear or rear-to-front direction as viewed from FIG. 2. The blocking flanges 180 received in the corresponding cutouts 24 of a lower portion of the fan 20 can prevent the fan 20 from moving horizontally along a laterally left-to-right or right-to-left direction as viewed from FIG. 2. Furthermore, the locking protrusions 1400 of the fan holder 10 are inserted into the corresponding mounting holes 220 of the fan 20, thereby preventing the fan 20 from moving vertically along a bottom-to-top direction as viewed from FIG. 2.

In this embodiment of the present invention, with a provision of the space between the connecting portions 16 and the main body 12 of the fan holder 10, an inward force towards the fan 20 is generated by the blocking wings 14 when the screws 80 engage in the screwing holes 32 of the base 30. By this, the locking protrusions 1400 of the blocking wings 14 are tightly engaged in the corresponding mounting holes 220 of the ears 22 of the lower portion of the fan 20, thereby to enable the lower portion of the fan 20 to have a secure connection with the fan holder 10. Thus, fan holder 10 can firmly secure the fan 20 to the base 30 at any directions. In addition, in the present invention, with the provision of the blocking flanges 180 fittingly engaging in the corresponding cutouts 24 of the fan 20, the baffle walls 18 blocking the two opposite lateral sides of the fan 20 and the locking protrusions 1400 being inserted into the corresponding mounting holes 220 of the fan 20, the fan 20 can be reliably and easily mounted to the fan holder 20. Furthermore, the fan holder 10 is not needed to engage with the fin assemblies 40, thereby maintaining an integrity of the fin assemblies 40 and enabling the fin assemblies to have a simple structure.

In use, the fin assemblies 40 absorb the heat from the CPU via the base 30. When the fan 20 located between the fin assemblies 40 operates, airflow generated by the fan 20 flows through channels of the fin assemblies 40 to take heat away therefrom. Accordingly, the heat generated by the CPU can be quickly dissipated. Inlet and outlet (not labeled) of the fan 20 face the fin assemblies 40, respectively. Almost all of the airflow generated by the fan 20 flows through the fin assemblies 40; thus, the heat dissipation efficiency of the heat dissipation device in accordance with the present invention is high.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fan holder adapted for securing a fan to a base of a heat dissipation device which has two fin assemblies, and the fan being located between the two fin assemblies of the heat dissipation device, the fan holder comprising:

a main body for holding the fan thereon;

a pair of connecting portions bent inwardly from a pair of two opposite sides of the main body and located above the main body;

a pair of blocking wings extending upwardly from free ends of the connecting portions, each blocking wing comprising a locking protrusion adapted for being inserted in the fan to prevent the fan from moving along a vertical direction of the fan holder; and a pair of baffle walls extending upwardly from another pair of two opposite sides of the main body and located between the blocking wings, the baffle walls being adapted for engaging two opposite sides of the fan for preventing the fan from moving along a front-to-rear direction, each baffle wall comprising a pair of blocking flanges extending inwardly from two opposite lateral sides thereof, the blocking flanges being adapted for fittingly received in cutouts defined in lower corners of the fan;

wherein the blocking wings and the blocking flanges are adapted for engaging with parallel plates of the fan for preventing the fan from moving laterally.

2. The fan holder as claimed in claim 1, wherein the connecting portions each are located parallel to the main body of the fan holder.

3. The fan holder as claimed in claim 2, wherein the blocking wings are extended vertically from the free ends of the connecting portions.

4. The fan holder as claimed in claim 3, wherein each blocking wing comprises a pair of hump-shaped upper ends and the locking protrusions are extended inwardly from an inner surface of the each blocking wing below the upper ends.

5. The fan holder as claimed in claim 4, wherein the each blocking wing defines a pair of depressions in an outer surface thereof, located corresponding top the locking protrusions.

6. The fan holder as claimed in claim 3, wherein the blocking flanges are located perpendicular to the main body and between the two blocking wings of the fan holder.

7. The fan holder as claimed in claim 6, wherein the connecting portions define a pair of through holes and the main body defines a pair of fixing holes corresponding to the through holes, adapted for extension of fasteners therethrough.

8. The fan holder as claimed in claim 7, wherein the through holes and the fixing holes are defined adjacent to the locking protrusions of the blocking wings.

9. A heat dissipation device comprises:
   a base adapted for absorbing heat from a heat-generating electronic component;
   two fin assemblies mounted on the base with a space between the two fin assemblies;
   a fan holder attached to the base and located between the fin assemblies, the fan holder having a main body and two blocking wings and two baffle walls extending upwardly from the main body, each blocking wing having a pair of locking protrusions extending inwardly from two opposite ends thereof and each baffle wall having a pair of blocking flanges extending inwardly from two opposite lateral sides thereof;
   a fan located between the two blocking wings and between the two baffle walls and mounted to the fan holder;
   wherein the locking protrusions of the blocking wings are inserted in the fan to prevent the fan from moving along a vertical direction of the fan holder and the blocking flanges of the baffle walls are fittingly received in cutouts defied in the fan to prevent the fan from moving horizontally along a lateral direction of the fan holder.

10. The heat dissipation device as claimed in claim 9, wherein the fan holder further comprises a pair of connecting portions each being located between a corresponding blocking wing and the main body, the each connecting portion being parallel to the main body and located above the main body.

11. The heat dissipation device as claimed in claim 10, wherein the fan comprises a pair of ears extending outwardly and parallel from each corner thereof, the locking protrusions of the blocking wings of the fan holder being fittingly received in the ears of the fan.

12. The heat dissipation device as claimed in claim 11, wherein the cutouts of the fan each are defied between the pair of ears of the fan.

13. The heat dissipation device as claimed in claim 10, wherein the blocking wings and the blocking flanges of the fan holder are located parallel to each other and the two baffle walls of the fan holder are located between the two blocking wings of the fan holder.

* * * * *